United States Patent

[11] 3,634,133

[72] Inventor Peter Albus
Sunnyvale, Calif.
[21] Appl. No. 806,201
[22] Filed Mar. 11, 1969
[45] Patented Jan. 11, 1972
[73] Assignee Siemens Aktiengesellschaft
Berlin, Germany
[32] Priority Mar. 20, 1968
[33] Germany
[31] P 17 64 004.9

[54] METHOD OF PRODUCING A HIGH-FREQUENCY SILICON TRANSISTOR
5 Claims, 3 Drawing Figs.

[52] U.S. Cl. .......... 148/187
[51] Int. Cl. .......... H01l 7/44
[50] Field of Search .......... 148/187, 188; 29/576, 578

[56] References Cited

UNITED STATES PATENTS 3,408,238 10/1968 Sanders .......... 148/187
3,498,853 3/1970 Dathe et al. .......... 148/187

*Primary Examiner*—Hyland Bizot
*Attorneys*—Curt M. Avery, Arthur E. Wilfond, Herbert L. Lerner and Daniel J. Tick

ABSTRACT: Described is a method of producing a diffusion transistor of silicon wherein both the base region and the emitter region are produced by employing an $SiO_2$ mask, by indiffusing an activator material obtained from the gaseous phase. Following the indiffusion of the base-coating activator obtained as an oxide from a gaseous phase, upon the already present $SiO_2$ masking, and of the oxide which newly coats the diffusion point, additional $SiO_2$ is precipitated from a reaction gas. The emitter region is produced by using the reinforced oxide layer as a mask, by diffusion and/or alloying. The above steps are undertaken, including the final contacting process, at a temperature which does not result in a notable penetration of doping material from the base region into the above-located oxide.

METHOD OF PRODUCING A HIGH-FREQUENCY SILICON TRANSISTOR

Figures 1, 2:
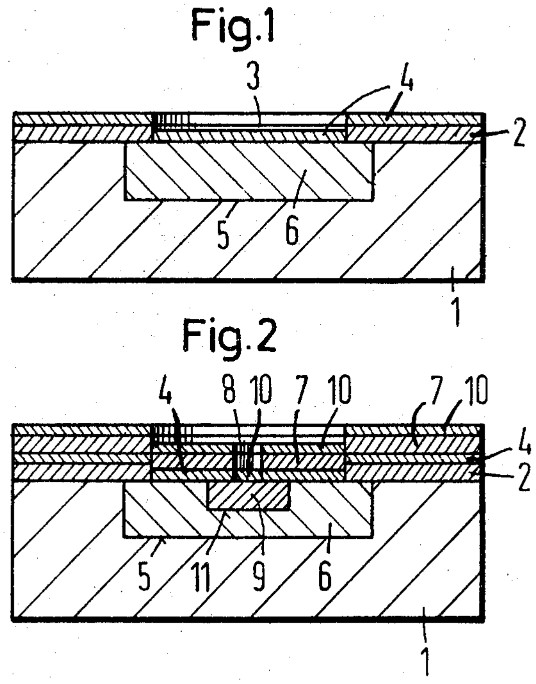

High-frequency transistors which are produced according to the planar method have a base region which is installed at one surface of a semiconductor crystal and a tub-shaped emitter region which is installed into the base region. As a rule, both regions are produced with the aid of a protective masking layer of either $SiO_2$ or $Si_3N_4$ which covers the semiconductor surface. In many instances, $SiO_2$ is preferred for the protective layer, especially if the transistor is to be produced from a silicon crystal. With a silicon base crystal, the $SiO_2$ layer can be conveniently produced by oxidation, more particularly through thermal oxidation of the silicon surface. This technique is obviously infeasible when other semiconductor materials, such as germanium or $A^{III}B^{V}$ compounds, are employed. In those instances, an $SiO_2$ masking layer must be produced by pyrolytic precipitation from an appropriate reaction gas, at the heated surface of the semiconductor crystal.

The usual way of producing a silicon planar transistor consists in providing, by thermal oxidation, the silicon surface with an $SiO_2$ layer approximately between 0.5 $\mu$ and 1.5 $\mu$ thickness. Thereafter, a diffusion window, which is required for the production of the base region, is etched according to the photovarnish method into the $SiO_2$ layer. The activator which dopes the base region is then diffused into the original material of the silicon crystal, accompanied by the formation of an approximately tub-shaped PN-junction The original material of the silicon crystal has the opposite conductance type. As a rule, the doping materials to be used are obtained from the gaseous phase in form of oxides. Generally, $B_2O_3$ is used to produce P-conducting regions and $P_2O_5$ is used to produce N-conducting regions. As a result, an $SiO_2$ layer reforms, with a strong concentration of dopant, at the silicon surface left exposed by the $SiO_2$ layer. To produce the emitter, which in principle is accomplished in the same manner as the base region, a second window is etched into the newly formed $SiO_2$ layer, at a distance from the window used for base diffusion. The activator which dopes the emitter is indiffused through the second window. The activator for the emitter, again in form of a gas, is caused to act upon the heated silicon crystal.

It is the object of my invention to effect a further improvement in the production of such silicon planar transistors as will be disclosed hereinafter.

The present invention relates to a method for producing a silicon diffusion transistor whereby both the base region and the emitter region are produced with the aid of a mask comprised of $SiO_2$, through indiffusion of activator material from the gaseous phase. According to the invention, following the indiffusion of the activator which coats the base region and which is obtained from the gaseous phase as its oxide, additional $SiO_2$ is precipitated from a reaction gas upon the already present $SiO_2$ mask. The oxide which coats the diffusion locality and the emitter region is then produced by diffusion and/or alloying, employing the reinforced oxide layer as a mask. These steps, including the final contacting, are carried out at a temperature which does not yet effect a notable penetration of the dopant from the base region into the above-located oxide. Thus, the processing temperatures should not exceed 900° C. On the other hand, I leave it open whether the $SiO_2$ masking layer, used to produce the base region, is to be produced through thermal oxidation or through pyrolytic precipitation, even at the customarily used high temperatures (above 1,000° C.). The advantages which a thermally produced oxide layer affords with respect to its masking properties and as a protective layer for the semiconductor surface, can be easily utilized during the first process steps, in so far as these steps relate to the production of the base region.

It is an object of the invention to produce a diffusion transistor, suitable for the highest frequencies, by means of the planar technique which combines the advantages of a low base expansion resistance and of extremely small base widths, i.e., of less than 1 $\mu$. During the production of planar transistors for use in highest frequencies, e.g., of NPN type, I find that in addition to technological difficulties the main problem is constituted by the base resistances which increase greatly as the base widths become smaller and smaller, and by the inverse voltages which are limited by a "punch through." However, the lowest possible base resistance during the reinforcement process is important, since among other things, the noise factor of the transistor is dependent thereon. Hence, the ratio of upper frequency limit to base resistance constitutes the quality rate for a transistor which is intended for use with very high frequencies.

Basically, a lower base resistance can be obtained in two ways, i.e.

1. by reducing the width of the emitter structures; and
2. by increasing the doping concentration, i.e., reducing the depths of penetration of the diffusion.

The second measure affords simultaneously a shift of the inverse voltages, which is limited by the punch-through effect, to higher magnitudes.

If, after reducing the emitter widths, the values become 5 $\mu$ or less, it becomes very difficult to etch-in photolithographically the windows, required to contact the emitter, into the masking layer which covers said emitter, without exposing the emitter-base PN-junction due to unavoidable errors in adjustment of the photovarnish mask. To avoid this chance, the fact that the oxide layer is naturally thinnest at the location of the emitter, is utilized. Thus, the semiconductor surface required for the purpose of contacting the emitter is exposed. The silicon disc is treated, following the production of the diffused emitter, over its entire surface in a liquid etching bath until the emitter window is free of oxide. The latter condition can be determined without difficulty, e.g., based on the different color of the oxidefree silicon. The emitter-base PN-junction is not exposed during this total-surface etching, since the activator used in the production of the emitter is also laterally indiffused below the stronger oxide which limits the emitter diffusion window. This type of method makes it quite possible to produce emitter structures up to 1 $\mu$ in width.

If one aims at producing smaller emitter structures, e.g., obtaining depths of penetration, needed for the HF transistors, up to 0.3 $\mu$m, this would mean that the emitter-base PN-junction is also spaced only 0.3 $\mu$m from the protective oxide edge. In order not to cause any short-circuits during the total-area etching, it becomes necessary that following the base diffusion the oxide layer is strong or large enough, $\approx$0.4 $\mu$. The distribution coefficient of boron i.e., base doping material in silicon, or $SiO_2$, is such that, due to the thermal oxidation generally used in conventional planar technology, a getter effect of the oxide will cause a reduction of boron in the lower lying $SiO_2$ surface. This would result in an impermissible increase in the base resistance. In order to avoid this getter effect and, nevertheless, to obtain a sufficiently thick oxide layer on the surface of the base region, the $SiO_2$ layer, following the production of the base region, is pyrolytically reinforced, in accordance with the invention, by dissociating silane in the presence of oxygen. It is pointed out that such a getter effect can also occur in association with other doping materials.

This combination of low penetration depths of diffusion and extremely narrow emitter structures makes it possible, by using precipitated oxide layers as maskings, to produce transistors whose limit frequency is more than 2 GHz and whose noise factor amounts to a maximum of 2 db., at adequate inverse voltages.

Figure 3:
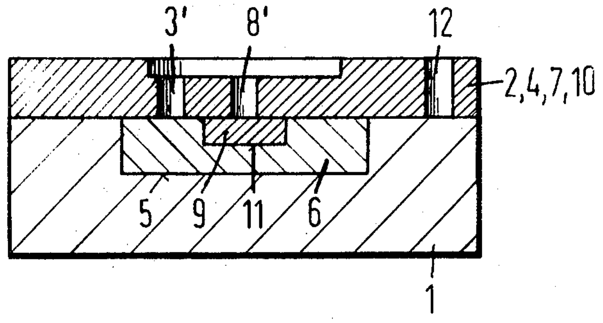

The invention is illustrated in FIGS. 1 to 3, which sequentially show the condition of a wafer-shaped silicon crystal, subjected to the process of the present invention, during the various stages of manufacture. Corresponding reference numerals in the FIGS. indicate the same parts.

The invention will be further described with respect to the drawing.

A layer 2 of $SiO_2$ is deposited by means of thermal oxidation upon an initially N-conducting disc-shaped silicon monocrystals 1. Oxidation takes place in a known manner, at a temperature of more than 1,000° C., in an atmosphere comprised of oxygen or steam. The window 3, needed to diffuse the activator material which coats the base region, is etched in, by using the known photovarnish method, e.g., using hydrofluoric acid. The thus prepared device, in a heated condition, is subjected to a $B_2O_3$- containing atmosphere. This a atmosphere produces at operational temperatures of approximately 1,000° C. another oxide layer 4, containing much boron, which coats the layer 2, as well as the semiconductor surface, at the location of window 3. Boron is simultaneously indiffused into the semiconductor crystal, with formation of a tub-shaped PN-junction 5. The depth of penetration amounts to approximately 1 $\mu$m. This condition is shown in FIG. 1 which shows the base region 6, limited by the PN-junction 5, embedded into the uninfluenced original material of the semiconductor disc 1, which subsequently constitutes the collector.

Another $SiO_2$ layer 7 is then precipitated from a known reaction gas such as silane or an orthosilicic acid ester such as tetraethoxysilane, at 700°–800° C. This layer protects the oxide which already consists of layers 2 and 4 and which protects the PN-junction 5, as well as the oxide at the location of the window 3. A window 8 is etched into the reinforced oxide layer by using the photovarnish method. This window serves in the production of the emitter. The width of the emitter window, for example, amounts to 3 $\mu$m.

The device is then again subjected, in heated condition, to the action of an activator, from the gaseous phase. The activator produces the opposite conductance type to that of the base region 3. This activator can be obtained in form of an oxide, e.g., $P_2O_5$.

The resulting condition is shown in FIG. 2 wherein an emitter region 9 is surrounded by the remaining portion of the base region 6. The PN-junction 11 of said emitter region 9 is protected by a relatively strong oxide layer 7 and by the remaining portions of the oxide layer 4, which still stems from the base diffusion. A newly formed thin layer of oxide has formed at the emitter window.

For the purpose of contacting the emitter, the disc is etched over its entire surface until the newly formed oxide layer 10 is at a distance from the emitter window 8. Thereupon, the surface of the remaining masking, including the exposed semiconductor surface, is coated with a photovarnish layer with whose aid an etching mask is produced which permits the exposure of that part necessary for contacting the base region. With the aid of the thus produced etching mask, the structure illustrated in FIG. 3 is obtained. After the etching mask, which is comprised of developed photovarnish, has been removed, the surfaces at the locality of the emitter, as well as of a location of the base, are free of oxide so that contacting becomes possible in a known manner, e.g., by conductive paths applied on the remaining oxide, and/or by alloying. In a similar manner, the photovarnish layer can also be used for exposing the surface of the original material of the semiconductor body 1, which is required for contacting the collector region. The window necessary for contacting the emitter is indicated at 8', the window for contacting the base region at 3' and the window for contacting the collector is depicted at 12.

The aforedescribed embodiment is particularly preferred though, as the artisan will immediately realize, modifications are possible. More particularly, it is not absolutely necessary to indiffuse the emitter. The latter can be produced by means of alloying, without impairing any of the technological advantages gained through the present invention.

I claim:

1. A method of producing a diffusion transistor of silicon wherein the base region and the emitter region are produced by employing an $SiO_2$ mask, and indiffusing an activator material obtained from the gaseous phase, which comprises producing an $SiO_2$ mask on a silicon body, etching a window in said mask, indiffusing the base coating activator from a gaseous phase of its oxide upon the already present $SiO_2$ mask, simultaneously producing an oxide layer which newly coats the diffusion location, precipitating additional $SiO_2$ from a reaction gas, and forming the emitter region with width of 1 to 5 $\mu$m and a depth of penetration of approximately 1 $\mu$m by using the reinforced oxide layer as a mask, with all the steps being undertaken, including the final contacting process, at a temperature not exceeding 900° C.

2. The method of claim 1, wherein the mask which coats the base region and which helps to diffuse the activator is comprised of thermally produced oxide.

3. The method of claim 1, wherein following the production of the emitter region for the purpose of exposing the contact point of the emitter, the disc-shaped semiconductor bodies are subjected to an etching process for exactly the period which it takes to expose the semiconductor surface at the emitter so that terminals may be contacted.

4. The method of claim 3, wherein a local etching treatment with the use of an etching mask, comprised particularly of photovarnish, is effected at least for the purpose of producing the terminal contacts for the collector and the base region.

5. The method of claim 1, wherein the reinforcement of the $SiO_2$ mask is effected below 900° C., from a reaction gas comprising silane, or an orthosilicic acid ester such as tetraethoxysilane with oxidizing components, particularly oxygen or steam.

* * * * *